United States Patent [19]

Oshita et al.

[11] Patent Number: 5,014,054
[45] Date of Patent: May 7, 1991

[54] DIGITAL-TO-ANALOG CONVERTER OF THE RESISTOR STRING TYPE

[75] Inventors: Koji Oshita, Kuwana; Takuya Harada, Okazaki, both of Japan

[73] Assignee: Nippondenso Co., Ltd., Kariya, Japan

[21] Appl. No.: 223,049

[22] Filed: Jul. 22, 1988

[30] Foreign Application Priority Data

Jul. 22, 1987 [JP] Japan ............................ 62-183039

[51] Int. Cl.$^5$ ............................................. H03M 1/68
[52] U.S. Cl. ..................................... 341/145; 341/153
[58] Field of Search ................. 341/144, 145, 146, 153

[56] References Cited

U.S. PATENT DOCUMENTS

| | | | |
|---|---|---|---|
| 4,318,085 | 3/1982 | Whiteside et al. | 341/153 |
| 4,491,825 | 1/1985 | Tuthill | 341/145 |
| 4,543,560 | 9/1985 | Holloway | 341/144 |
| 4,647,903 | 3/1987 | Ryu | 341/145 |
| 4,665,381 | 5/1987 | Masuda et al. | 341/145 |

FOREIGN PATENT DOCUMENTS

| | | |
|---|---|---|
| 55-60333 | 5/1980 | Japan . |
| 58-84534 | 5/1983 | Japan . |
| 59-54326 | 3/1984 | Japan . |
| 60-29034 | 2/1985 | Japan . |

OTHER PUBLICATIONS

"Nonlinearity Analysis and Evaluation of Resistor String A/D Converters": A Thesis on pp. 941-948 of National Convention Record edited by the Institute of Electronics, Information and Communication Engineers in Japan, '84/12 vol. J67-CNo. 12.

Partial Copy of National Convention for 70th Anniversary of the Institute of Electronics, Information and Communication Engineers.

Primary Examiner—William M. Shoop, Jr.
Assistant Examiner—Marc S. Hoff
Attorney, Agent, or Firm—Cushman, Darby & Cushman

[57] ABSTRACT

A digital-to-analog converter of the resistor string type comprises a string of resistors for dividing a reference voltage into a series of divided voltages, and a switch matrix circuit for selectively generating the divided voltages as an analog signal when activated in response to a digital signal. The string of resistors are divided and folded into four square arrays, one pair of the four square arrays being arranged diagonally to the other pair of the four square arrays respectively. The switch matrix circuit includes four switching circuits for generating respective ore divided voltages from the four square arrays when activated respectively, and four decoder circuits for activating the four switching circuits in response to the digital signal respectively and for generating the respective one divided voltages from the four switching circuits in relation to a portion of the digital signal respectively. Furthermore, a selector is responsive to the digital signal for selecting one of the respective one divided voltages from the four decoder circuits in relation to the remaining portion of the digital signal to generate the selected one divided voltage as the analog signal.

9 Claims, 8 Drawing Sheets (a)

(b)

(c)

(a)

(b)

(a)

(b)

DIGITAL-TO-ANALOG CONVERTER OF THE RESISTOR STRING TYPE

BACKGROUND OF THE INVENTION

1. Field of the Invention

The present invention relates to analog-to-digital converters and the like, and more particularly to a digital-to-analog converter of the resistor string type.

2. Description of the Background

FIG. 11, shows a recently proposed digital-to-aralog converter of the resistor string type which has been arranged on a wafer within, for instance, an analog-to-digital converter assembly of the successive-approximatior type. The digital-to-analog converter includes a string of $2^n$ resistors r , . . . , r respectively, each with a substantially identical resistance value which are connected in series with each other between $V_{ref}+$ and $V_{ref}-$ terminals of a reference voltage source to be applied with a reference voltage $V_{ref}$ thereto. This means that the resistors r , . . . , r divide the reference voltages $V_{ref}$ produce a series of divided voltages respectively at their common terminals p , . . . , p. The string of resistors r , . . . , r are divided into a plurality of resistor string units R , . . . , R and folded into a square array along a line direction in order to save the wafer and to lessen process variations. The digital-to-analog converter includes a plurality of row lead wires 100 , . . . , 100 which are arranged on the wafer respectively in parallel with the resistor string units R, . . . , R to selectively pick up the divided voltages from the common terminals p , . . . , p of the string of resistors r , . . . , r. A plurality of line lead wires 101 , . . . , 101 corresponding respectively to the resistors of the resistor string units R , . . . , R are also arranged to cross respectively the resistor string units R , . . . , R. In this case, the row and line lead wires 100 , . . . , 100 and 101, . . . , 101 are selected by row and line decoders 102 and 103, respective. Furthermore, each of a plurality of switching elements in the form of a Field Effect Transistor or FET is connectd between the corresponding common terminal p and the corresponding line lead wire 101. Then, each of switching elements 104 , . . . , 104 is turned on through the corresponding row lead wire 100 by the row decoder 102 to output the divided voltage from the corresponding common terminal p through the corresponding line lead wire 101 as a voltage to be successively compared with an analog input voltage.

In such a construction as described above, the resistors r , . . . , r are fabricated in P+ and N+ diffusing areas of the wafer. This means that due to the diffusing process for fabricating the string of resistors r , . . . , r, variations in resistance values of resistors r , . . . , r will be caused with an incline from the one resistor r corresponding to the most significant position to the other resistor r corresponding to the least significant position. From this aspect, it will be observed that an incline in variations of resistance values of resistors r , . . . , r along the line director may be substantially cancelled owing to the folded arrangement of the string of resistors r , . . . , r, whereas an incline in variations of resistance values at each resistor string unit R along the row direction may not be cancelled. This means that resistance values of resistors r , . . . , r change with an incline from the left-side resistor string unit R to the right-side resistor string unit R. As a result, the output voltage from the digital-to-analog converter has a large deviate from an ideal value of $V_{ref}/2$, as shown by a curved line a in FIG. 6, to cause an increased nonlinearity error.

In determining the most significant bit or MSB in the digital-to-analog converter of the successive-approximation type, an output voltage indicative of $V_{ref}/2$ is compared with the analog input voltage. The next most significant bit is obtained by using another output voltage indicative of one of $V_{ref}/4$ and $3 V_{ref}/4$ which is compared with the analog input voltage. In this instance, a settling time of the digital-to-analog converter is defined by the total of resistance values of resistors r between the corresponding terminal p and the ground and parasitic capacities such as junction capacities of the switching elements 104 and the like. Furthermore, a settling time from the output voltage indicative of $V_{ref}/2$ to another output voltage indicative of $V_{ref}/4$ or $3 V_{ref}/4$ is longer than that for determination of each of the remaining bits, because the output voltage indicative of $V_{ref}/2$, $V_{ref}/4$ or $3 V_{ref}/4$ is higher than that for each of the remaining bits. This means that the settling time for determination of the MSB substantially defines a time period required for analog-to-digital conversion in all the bits. Thus, for a decrease of the time period in the analog-to-digital conversion, it is inevitably required to decrease the settling time or resistance values in the string of resistors r, . . . , r. However, this causes an increase in area of the layout pattern for the string of resistors r, . . . , r and in its wiring resistance values, resulting in an increase of nonlinearity error in the digital-to-analog converter.

SUMMARY OF THE INVENTION

It is, therefore, a primary object of the present invention to provide a digital-to-analog converter of the resistor string type, capable of decreasing nonlinearity error or improving precision in linearity in spite of variations with an incline in resistance values of a string of resistors.

It is another object of the present invention to provide a digital-to-analog converter of the resistor string type, having the above-mentioned characteristics, capable of shortening a settling time for converting a digital form into an analog form.

According to the present invention, the primary object is accomplished by providing a digital-to-analog converter of the resistor string type for converting a digital signal into an analog signal. The digital to analog converter comprises:

a string of resistors for dividing a reference voltage into a series of divided voltages; and switch matrix circuit means coupled with the resistors for selectively generating the divided voltages as the analog signal when activated in response to the digital signal;

the improvement wherein the string of resistors are divided into four square arrays, one of the four square arrays being arranged diagonally to another of the four square arrays respectively; and wherein the switch matrix circuit means includes:

four switching means coupled to the four square arrays for generating respective divided voltages from the four square arrays when activated respectively;

four decoder means coupled with the four switching means for activating the four switching means in response to the digital signal respectively and for generating the respective one divided voltages from the four switching means in relation to a portion of the digital signal respectively; and selection means responsive to the digital signal for selecting one of the respective one divided voltages from the four decoder means in relation to the remaining portion of the digital signal to generate the selected one divided voltage as the analog signal.

In an aspect of the present invention, the remaining decoder means except one of the four decoder means related to the selected one divided voltage are arranged to maintain the remaining respective one divided voltages except the selected one divided voltage in a predetermined level in relation to the remaining portion of the digital signal respectively.

BRIEF DESCRIPTION OF THE DRAWINGS

Other objects, features and advantages of the present invention will be readily appreciated by the following detailed description of preferred embodiments thereof when considered with reference to the accompanying drawings, in which.

DESCRIPTION OF THE PREFERRED EMBODIMENTS

Figure 1:
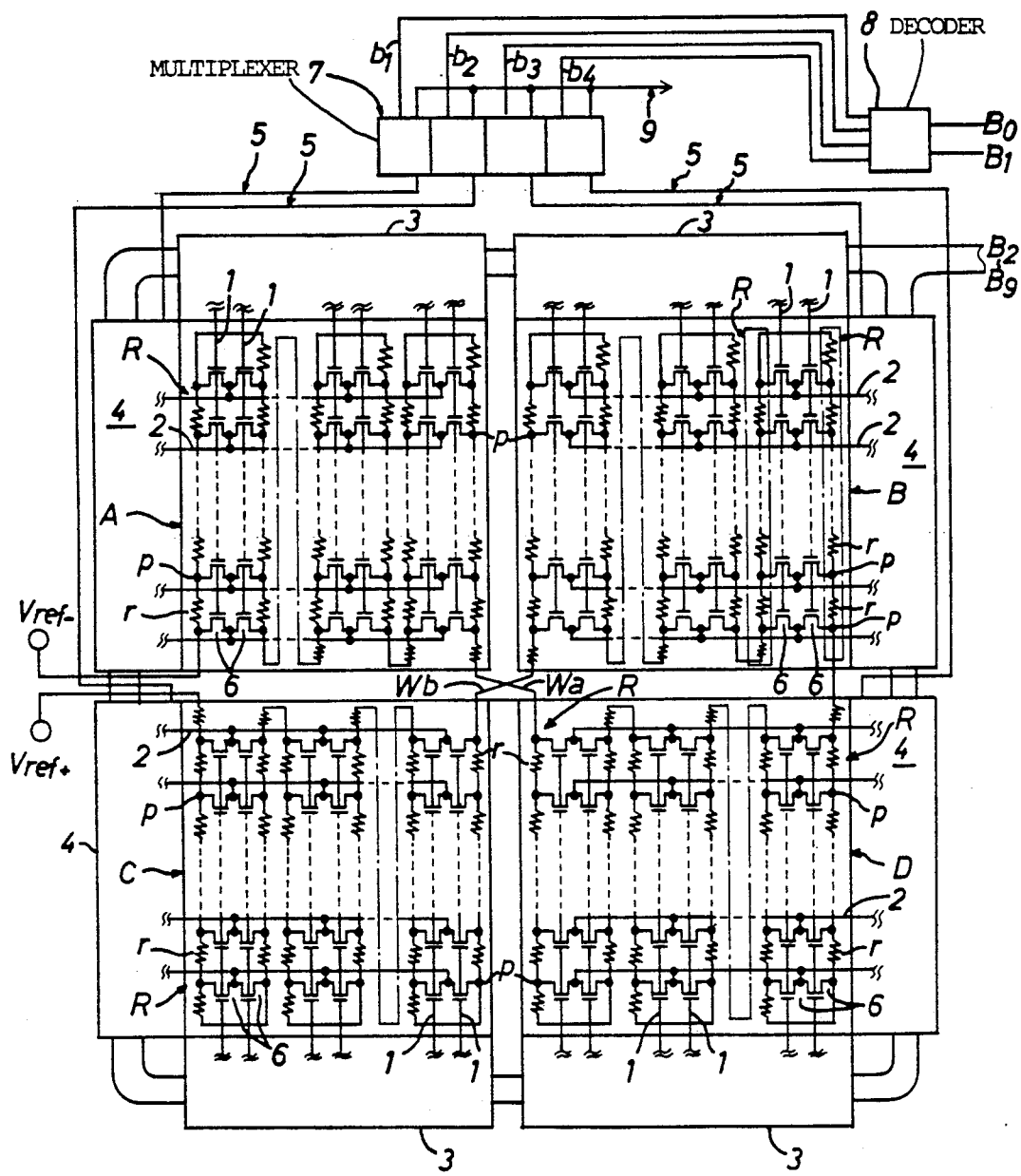
FIG. 1 is a block diagram of a digital-to-analog converter in accordance with the present invention.

Referring now to FIG. 1 of the drawings, there is illustrated a 10-bit digital-to-analog converter of the resistor string type in accordance with the present invention which is arranged on a wafer in for instance an analog-to-digital converter of the successive-approximation type. The digital-to-analog converter includes a string of 1024 resistors r , . . . , r which respectively have substantially an identical resistance value and are connected in series with each other between $V_{ref}^-$ and $V_{ref}^+$ terminals of a reference voltage source. The string of resistors r , . . . , r divide a reference voltage $V_{ref}$ from the reference voltage source into a series of divided voltages and produce these divided voltages respectively at their common terminals p , . . . , p. The string of resistors r , . . . , r are divided into a plurality of resistor string units R , . . . , R and arranged in folded way into four square arrays of resistance A, B, C and D along a line direction (See FIG. 1). In this case, the resistor string units R , . . . , R within each of the square arrays A, B, C and D are composed of 256 resistors r , . . . , r. As shown in FIG. 1, the square array A is located diagonally to the square array D, whereas the square array B is located diagonally to the square array C. The lowermost resistor r of the left-hand resistor string unit R in square array A is connected to the $V_{ref}^-$ terminal of the reference voltage source, whereas the lowermost resistor r of the right-hand resistor string unit R in square array A is connected by a wiring $W_a$ to the uppermost resistor r of the left-hand resistor string unit R in square array D. The uppermost resistor r of the right-hand resistor string unit R in square array D is connected to the lowermost resistor r of the right-hand resistor string unit R in square array B. The uppermost resistor r of the left-hand resistor string unit R in square array C is connected to the $V_{ref}^+$ terminal of the reference voltage source, whereas the uppermost resistor r of the right-hand resistor string unit R in square array C is connected by a wiring $W_b$ to the lowermost resistor r of the left-hand resistor string unit R in square array B.

As shown in FIG. 1, a first group of row lead wires 1 , . . . , 1 are alternately arranged in parallel with the respective resistor string units R , . . . , R of square array A, a second group of row lead wires 1 , . . . , 1 are alternately arranged in parallel with the respective resistor string units R , . . . , R of square array B, a third group of row lead wires 1 , . . . , 1 are alternately arranged in parallel with the respective resistor string units R , . . . , R of square array C, and a fourth group of row lead wires 1 , . . . , 1 are alternately arranged in parallel with the respective resistor string units R , . . . , R of square array D. Meanwhile, a first group of line lead wires 2 , . . . , 2 are arranged to cross the first group of row lead wires 1 , . . . , 1 and to correspond respectively to the resistors r , . . . , r of one resistor string unit R in square array A, and a second group of line lead wires 2 , . . . , 2 are arranged to cross the second group of row lead wires 1 , . . . , 1 and to correspond respectively to the resistors r , . . . , r of one resistor string unit R in square array B. A third group of line lead wires 2 , . . . , 2 are arranged to cross the third group of row lead wires 1 , . . . , 1 and to correspond respectively to the resistors r , . . . , r of one resistor string unit R in square array C, and a fourth group of line lead wires 2 , . . . , 2 are arranged to cross the fourth group of row lead wires 1 , . . . , 1 and to correspond respectively to the resistors r , . . . , r of one resistor string unit R in square array D.

Figure 2:
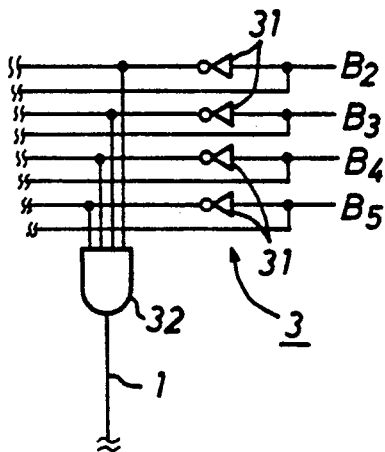
FIG. 2 illustrates a circuit portion of the row decoder shown in FIG. 1.

For selecting desired row and line lead wires from the respective groups of row and line lead wires 1 , . . . , 1 and 2 , . . . , 2, first to fourth row decoders 3 to 3 are connected respectively to the first to fourth groups of row lead wires 1 , . . . , 1, and first to fourth line decoders 4 to 4 are connected respectively to the first to fourth groups of line lead wires 2 , . . . , 2. Each of the first to fourth row decoders 3 to 3 comprise a plurality of circuit portions which are respectively connected to the row lead wires 1 , . . . , 1 of the first to fourth groups. FIG. 2 illustrates one of the circuit portions of each of the first to fourth row decoders 3 to 3. The circuit portion of FIG. 2 includes four inverters 31 to 31 which function to provide eight signal lines on a basis of four-bit input lines $B_2$, $B_3$, $B_4$ and $B_5$. An AND-gate 32 cooperates with inverters 31 to 31 to selectively produce a selection signal on the row line 1 in relation to signals appearing respectively on the signal lines connected respectively to outputs of inverters 31 to 31.

Figure 3:
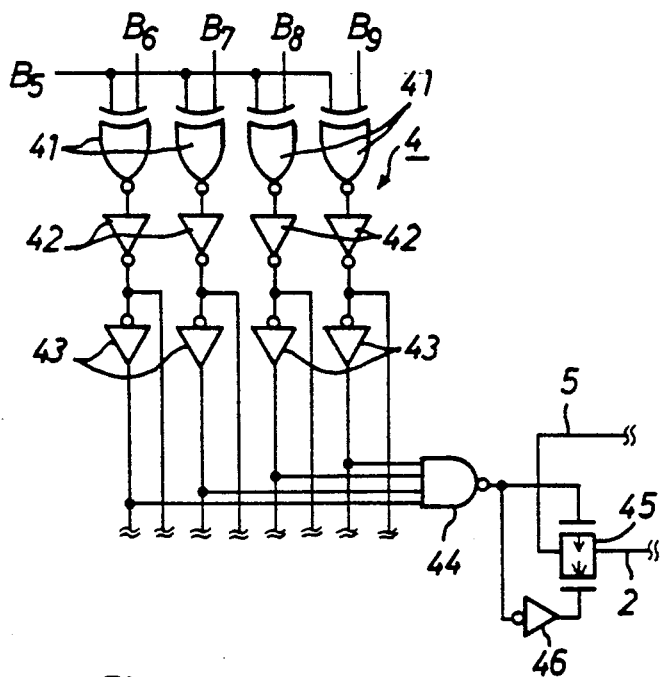
FIG. 3 depicts a circuit portion of the line decoder shown in FIG. 1.

Each of the first to fourth line decoders 4 to 4 comprises a plurality of circuit portions which are respectively connected to the line lead wires 2, ..., 2 of the first to fourth groups. FIG. 3 illustrates one of the circuit portions of each of the first to fourth line decoders 4 to 4. The circuit portion of FIG. 3 includes four exclusive NOR gates 41 to 41 which function to provide eight signal lines by way of inverters 42 to 42 and 43 to 43 on a basis of five-bit input lines $B_5$, $B_6$, $B_7$, $B_8$ and $B_9$. A NAND gate 44 cooperates with inverters 43 to 43 to selectively produce a selection signal in relation to signals appearing respectively on the signal lines connected respectively to outputs of inverters 43 to 43. A switching element 45 in the form of Field Effect Transistor or FET receives the selection signal from NAND gate 44 and is controlled by an inverter 46 responsive to the selection signal from NAND gate 44 to be turned on so as to permit electrical connection between the line lead wire 2 and an output line 5 of one of line decoders 4 to 4 (see FIGS. 1 and 3).

Figure 4:
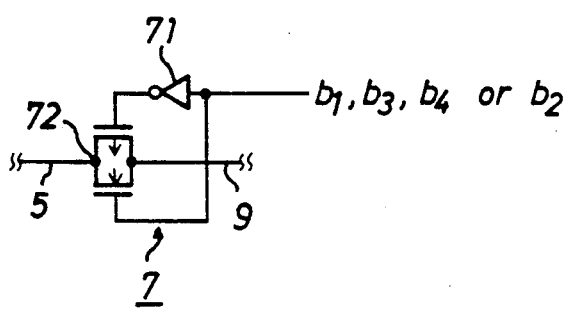
FIG. 4 represents a circuit portion of the multiplexer shown in FIG. 1.
Figure 5:
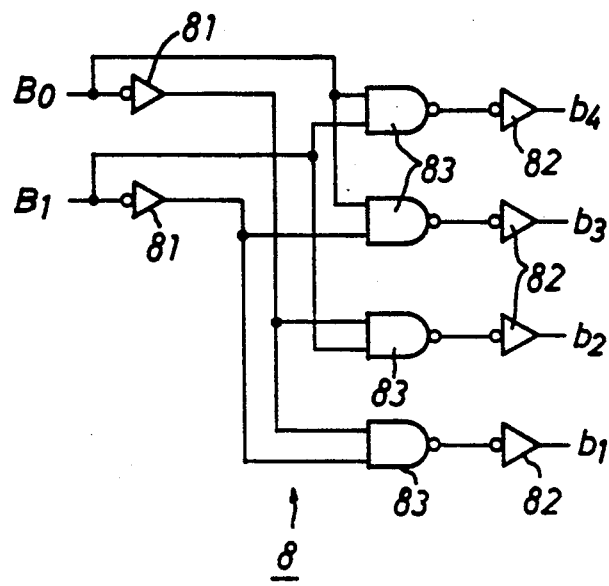
FIG. 5 illustrates a logic circuit of the decoder shown in FIG. 1.

As shown in FIG. 1, each of switching elements or FETs 6, 6 is connected between each common terminal p of respective adjacent resistors r, r and each corresponding line lead wire 2. When a selection signal from one of row decoders 3 to 3 is applied through one of the row lead wires 1, ..., 1 to the gate of one of FETs 6, ..., 6, the one of FETs 6, ..., 6 is conducted to permit electrical connection between one of the common terminals p, ..., p and one of the line lead wires 2, ..., 2. A multiplexer 7 is connected to the output lines 5, ..., 5 of line decoders 4 to 4. The multiplexer 7 comprises four circuit portions one of which is shown in FIG. 4. The circuit portion of multiplexer 7 includes a switching element or FET 72 which is connected through an inverter 71 to a signal line $b_1$, $b_2$, $b_3$ or $b_4$ (see FIG. 1). When a selection signal is received from one of line decoders 4 to 4, the switching element 72 is turned on to permit electrical connection between one of the output lines 5 and an external line 9. As shown in FIGS. 1 and 5, a decoder 8 includes a pair of inverters 81, 81, four NAND gates 83 to 83, and four inverters 82 to 82. NAND gates 83 to 83 cooperate with inverters 81, 81 to provide the four signal lines $b_1$, $b_2$, $b_3$ and $b_4$ on a basis of two-bit input lines $B_0$, $B_1$ by way of inverters 82 to 82. The signal line $b_1$, $b_2$, $b_3$ and $b_4$ act a role respectively as an input control line for the circuit portions of multiplexer 7.

In operation, when a ten-bit digital signal is applied to the input lines $B_0$ to $B_9$, the multiplexer 7 cooperates with the decoder 8 responsive to signals appearing on the input lines $B_0$, $B_1$ to permit electrical connection between the external line 9 and the output line 5 of line decoder 4 for one of the square arrays A, B, C and D. This means that the multiplexer 7 cooperates with decoder 8 to select one of the square arrays A to D on a basis of the signals appearing on the input lines $B_0$, $B_1$. At the same time, the row decoders 3 to 3 produce respectively selection signals on respective one row lead wires of the first to fourth groups of the row lead wires 1, ..., 1 in relation to signals appearing on the input lines $B_2$ to $B_5$. This activates the switching elements 6, ..., 6 connected to the respective one row lead wires. Meanwhile, the line decoders 4 to 4 respectively select respective one line lead wires of the first to fourth groups of line lead wires 2, ..., 2 in relation to signals appearing on the input lines $B_5$ to $B_9$. Thus, the respective one line lead wires are electrically connected by the line decoders 4 to 4 to the output lines 5 to 5 respectively. This means that a divided voltage appearing at one of the common terminals p, ..., p in the selected square array is applied through one of the respective one line lead wires and one of the output lines 5 to 5 by multiplexer 7 to the external line 9 as a voltage to be compared with an analog input voltage. In the embodiment, the above-mentioned operation is repeated in accordance with successive digital signals such that divided voltages respectively appearing at the common terminals p, ..., p of the string of resistors r, ..., r are selectively applied to the external line 9 to be compared with the analog input voltage. This means to determine MSB to LSB defining the analog input signal.

Figure 6:
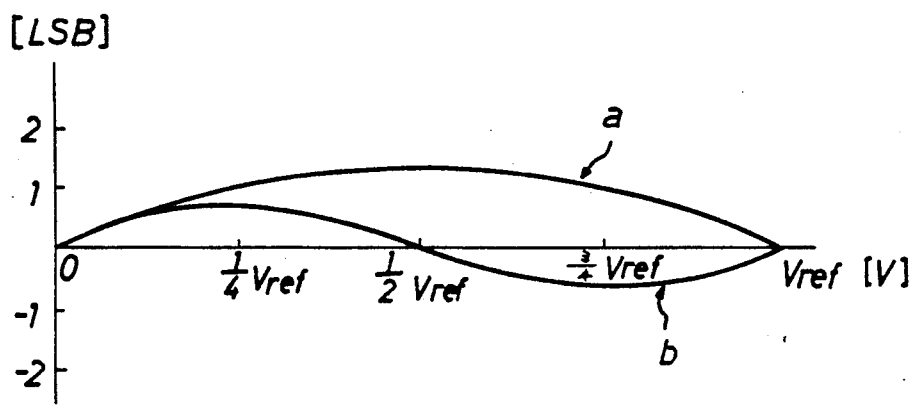
FIG. 6 depicts graphs respectively illustrative of nonlinearity error of a divided voltage from a string of resistors in relation to an ideal value.

As understood from the above-description, both the square arrays B and C connected directly by the wiring $W_b$ are diagonally located on the wafer, whereas the square arrays A and D connected directly by the wiring $W_a$ are diagonally located on the wafer. Thus, variations with an incline along the row direction in resistance values of the resistor string units R in the square array B (or A) may be cancelled by variations with an incline along the same row direction in resistance values of the resistor string units R in the square array C (or D). As a result, as shown by a curved line b of FIG. 6, nonlinearity error decreases substantially down to zero at $V_{ref}/2$, and the maximum nonlinearity error or nonlinearity error at $V_{ref}/4$ or $3 V_{ref}/4$ decreases substantially down to a half of the nonlinearity error defined at $V_{ref}/4$ or $3 V_{ref}/4$ by the curved line a. This leads to a reduction in manufacturing cost of the digital to analog converter. In this instance, the maximum nonlinearity error defined by the curved line a is 1.27 LSB, whereas the maximum nonlinearity error defined by the curved line b is 0.67 LSB. In the embodiment, 1 LSB is equal to $2^{-10} \times V_{ref}(V)$. In addition, because the resistor string units R, ..., R in each of the square arrays A to D are folded on the wafer and connected in series to each other, as previously described, variations with an incline along the line direction in resistance values of resistors r, ..., r may be cancelled at each of square arrays A to D to thereby improve precision of linearity in the string of resistors r, ..., r.

Figure 11:
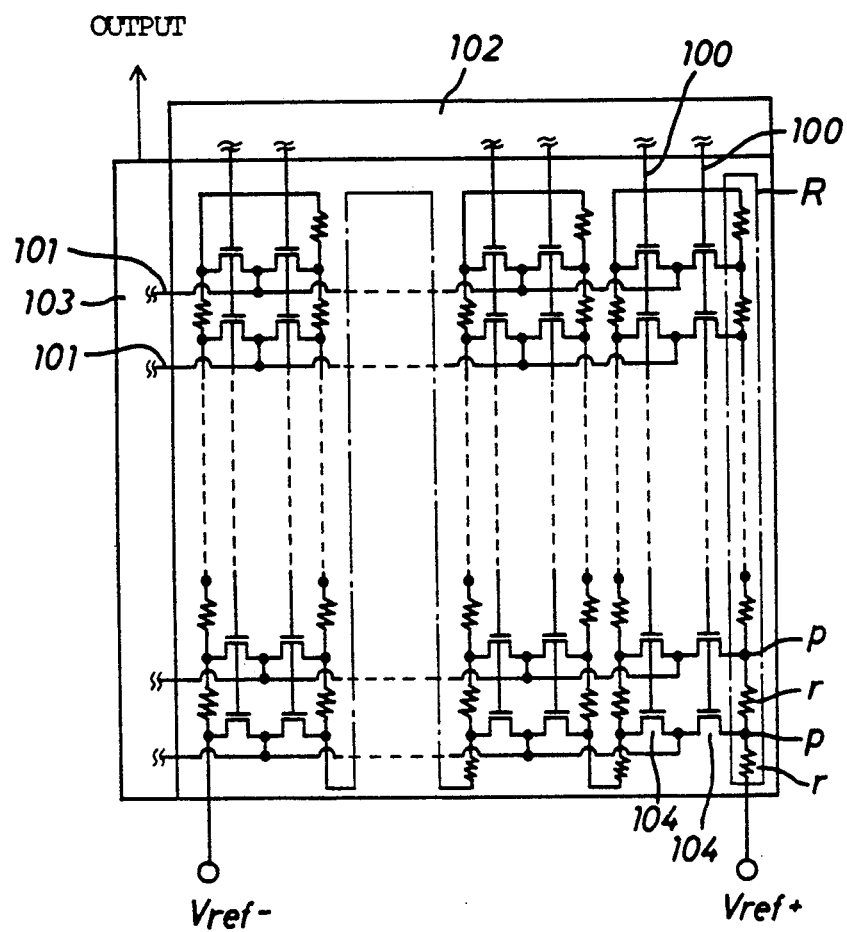
FIG. 11 is a block diagram of a digital-to-analog converter disclosed in the prior art.

Furthermore, the string of resistors r, ..., r are divided into the four square arrays A to D each of which are located separated from each other as previously described. For this reason, it will be recognized that the total length of resistors r, ..., r in each of the square arrays A to D may be shortened without any mutual influences in wiring among the square arrays A to D. And it will be also recognized that the number of switching elements 6, ..., 6 in each of square arrays A to D decreases substantially down to a quarter of the number of the switching elements in the prior art of FIG. 11. This means that the total of parasitic capacities in each of the square arrays A to D decreases substantially down to a quarter of the total of parasitic capacities in prior art of FIG. 11. Thus, a time constant defined by the resistors r, ..., r and switching elements 6, ..., 6 in each of the square arrays A to D decreases substantially down to a quarter of a time constant defined by prior art shown in FIG. 11.

From the above description, it will be understood that settling times respectively for determining MSB to LSB in the digital-to-analog converter may be shortened without any decrease of resistance values of resistors r, ..., r or undesired increase of wiring resistance values. In this instance, the multiplexer 7 selects one of the square arrays A to D on a basis of signals appearing on the input lines $B_0$, $B_1$. In selective operation of multiplexer 7, a divided voltage indicative of zero(V) is produced from one of the common terminals p, ..., p in the square array A, a divided voltage indicative of $V_{ref}/4$ is produced from one of the common terminals p, ..., p in the square array D, a divided voltage indicative of $V_{ref}/2$ is produced from one of the common terminals p, ..., p in the square array B, or a divided voltage indicative of $3 V_{ref}/4$ is produced from one of the common terminals p, ..., p in the square array C. From this reason, a settling time from $V_{ref}/2$ to one of $V_{ref}/4$ and $3 V_{ref}/4$ may be decreased to a negligible value such that a settling time from $V_{ref}/4$ to one of $V_{ref}/8$ and $3 V_{ref}/8$ mainly defines a time period in digital-to-analog conversion together with a settling time from $3 V_{ref}/4$ to one of $5 V_{ref}/8$ and $7 V_{ref}/8$ to decrease the amplitude in the divided voltage substantially down to a half of that from $V_{ref}/2$ to one of $V_{ref}/4$ and $3 V_{ref}/4$. This results in shortening of the settling time.

Figure 7:
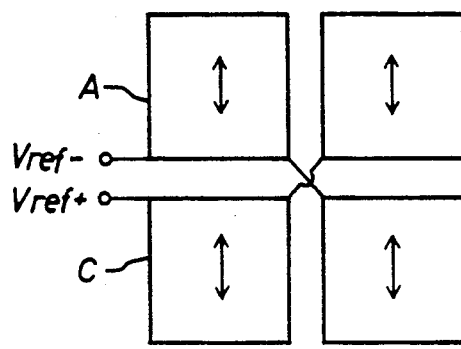
FIG. 7(a) illustrates schematically all the square arrays shown in FIG. 1.
FIGS. 7(b) and 7(c) illustrate respectively modifications of the square arrays shown in FIG. 7(a)
Figure 7:
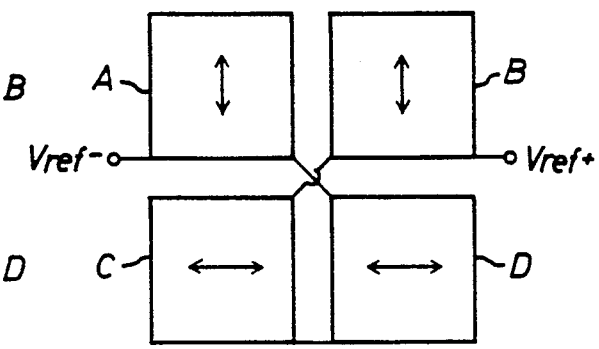
Figure 7:
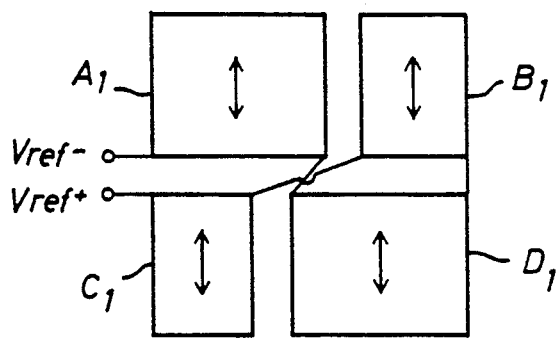

Although in the embodiment the square arrays A to D are located and connected to each other, as shown schematically in FIG. 7(a), to connect the square arrays A, D to the reference voltage source, they may be connected to each other as shown schematically in FIG. 7(b), to connect the square arrays A, B to the reference voltage source.

While in the embodiment the number of resistors r, ..., r in each of the square arrays A to D is 256, it may be modified as necessary. Furthermore, the square arrays A to D may be replaced with square arrays $A_1$ to $D_1$ located and connected to each other, as shown in FIG. 7(c). In this case, the number of resistors r, ..., r increases in each of square arrays $A_1$, $D_1$, whereas the number of resistors r, ..., r decreases in each of square arrays $B_1$, $C_1$.

Figure 8:
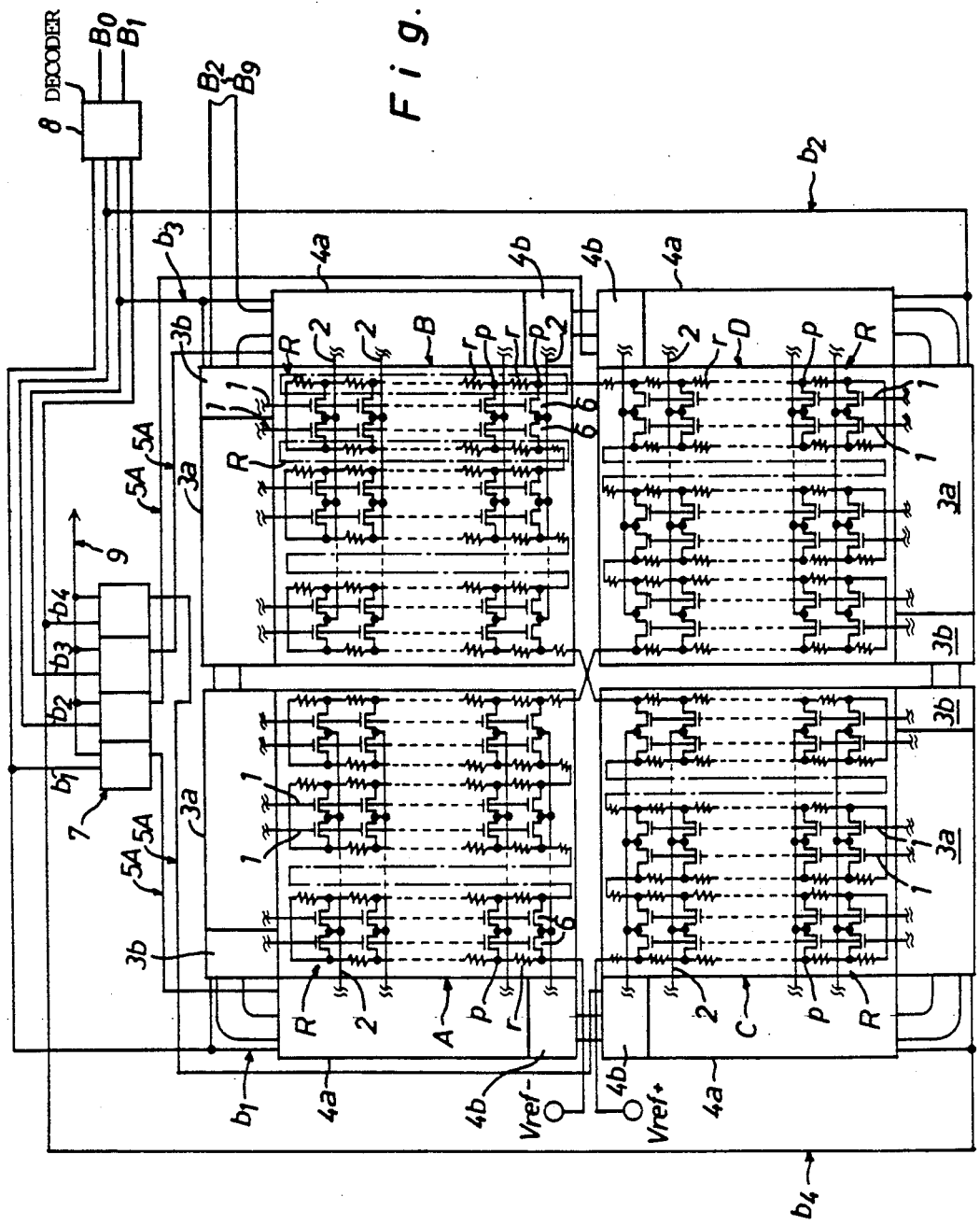
FIG. 8 illustrates a modification of the digital-to-analog converter shown in FIG. 1.
Figure 9:
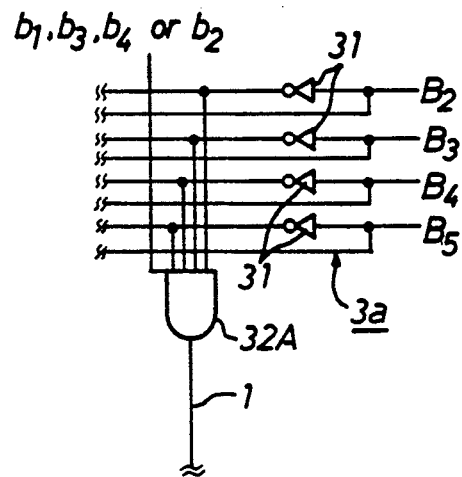
FIGS. 9(a) and 9(b) represent respectively partial logic circuits of each pair of row decoders shown in FIG. 8.
Figure 9:
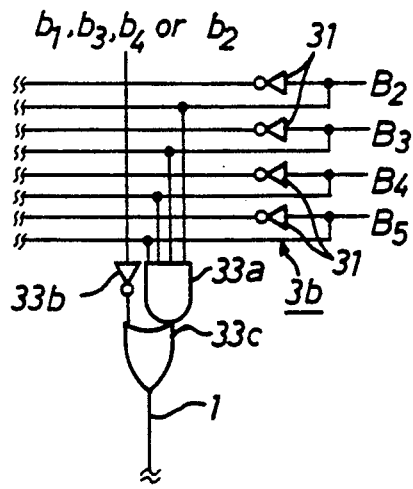

FIG. 8 illustrates a modification of the previous embodiment in which row decoders 3, ..., 3 of the previous embodiment are replaced with respective pairs of row decoders 3a, 3b; ...; 3a 3b and in which line decoders 4, ..., 4 of the previous embodiment are replaced with respective pairs of line decoders 4a, 4b; ...; 4a, 4b. As shown in FIG. 9(a), each of the row decoders 3a to 3a includes a circuit portion corresponding to the circuit portion of row decoder 3 (see FIG. 2). The circuit portion shown in FIG. 9(a) has an AND gate 32A corresponding to AND gate 32 shown in FIG. 2. In this case, AND gate 32A of the row decoder 3a for the square array A is connected at its input terminals to output terminals of inverters 31 to 31 and also to the signal line $b_1$, and AND gate 32A of the row decoder 3a for the square array B is connected at its input terminals to output terminals of inverters 31 to 31 and also to the signal line $b_3$ (see FIG. 8). AND gate 32A of the row decoder 3a for the square array C is connected at its input terminals to output terminals of inverters 31 to 31 and also to the signal line $b_4$, and AND gate 32A of the row decoder 3a for the square array D is connected at its input terminals to output terminals of inverters 31 to 31 and also to the signal line $b_2$ (see FIG. 8). Other construction of the circuit portion shown in FIG. 9(a) is the same construction as that shown in FIG. 2.

FIG. 9(b) illustrates each of the row decoders 3b to 3b which has the construction similar to that of the circuit portion of row decoder 3a shown in FIG. 9(a). An AND gate 33a is connected at its input terminals respectively to the input lines $B_2$ to $B_5$. An inverter 33b of row decoder 3b for the square array A is connected at its input terminal to the signal line $b_1$ (see FIG. 8) to invert a signal appearing on the signal line $b_1$, and an inverter 33b of row decoder 3b for the square array B is connected at its input terminal to the signal line $b_3$ (see FIG. 8) to invert a signal appearing on the signal line $b_3$. An inverter 33b of row decoder 3b for the square array C is connected at its input terminal to the signal line $b_4$ (see FIG. 8) to invert a signal appearing on the signal line $b_4$, and an inverter 33b of row decoder 3b for the square array D is connected at its input terminal to the signal line $b_2$ (see FIG. 8) to invert a signal appearing on the signal line $b_2$. An OR gate 33c of row decoder 3b for the square array A is activated by AND gate 33a and inverter 33b to select the row lead wire 1 connected through the corresponding switching elements 6, ..., 6 to the resistor string unit R defining a least significant position in the square array A. An OR gate 33c of row decoder 3b for the square array B is activated by AND gate 33a and inverter 33b to select the row lead wire 1 connected through the corresponding switching elements 6, ..., 6 to the resistor string unit R defining a least significant position in the square array B. An OR gate 33c of row decoder 3b for the square array C is activated by AND gate 33a and inverter 33b to select the row lead wire 1 connected through the corresponding switching elements 6, ..., 6 to the resistor string unit R defining a least significant position in the square array C. An OR gate 33c of row decoder 3b for the square array D is activated by AND gate 33a and inverter 33b to select the row lead wire 1 connected through the corresponding switching elements 6, ..., 6 to the resistor string unit R defining a least significant position in the square array D. Other construction of each of the row decoders 3b to 3b is the same construction as the circuit portion shown in FIG. 9(a).

As shown in FIG. 10(a), each of the line decoders 4a to 4a includes a circuit portion corresponding to the circuit portion of line decoder 4 (see FIG. 3). The circuit portion shown in FIG. 10(a) has a NAND gate 44A corresponding to NAND gate 44 shown in FIG. 3. In this case, NAND gate 44A of the line decoder 4a for the square array A is connected at its input terminals to output terminals of inverters 43 to 43 and also to the signal line $b_1$ (see FIG. 8), and NAND gate 44A of the line decoder 4a for the square array B is connected at its input terminals to output terminals of inverters 43 to 43 and also to the signal line $b_3$ (see FIG. 8). NAND gate 44A of the line decoder 4a for the square array C is connected at its input terminals to output terminals of inverters 43 to 43 and also to the signal line $b_4$ (see FIG. 8), and NAND gate 44A of the line decoder 4a for the square array D is connected at its input terminals to output terminals of inverters 43 to 43 and also to the signal line $b_2$ (see FIG. 8). Other construction of the circuit portion shown in FIG. 10(a) is the same construction as that shown in FIG. 3.

Figure 10:
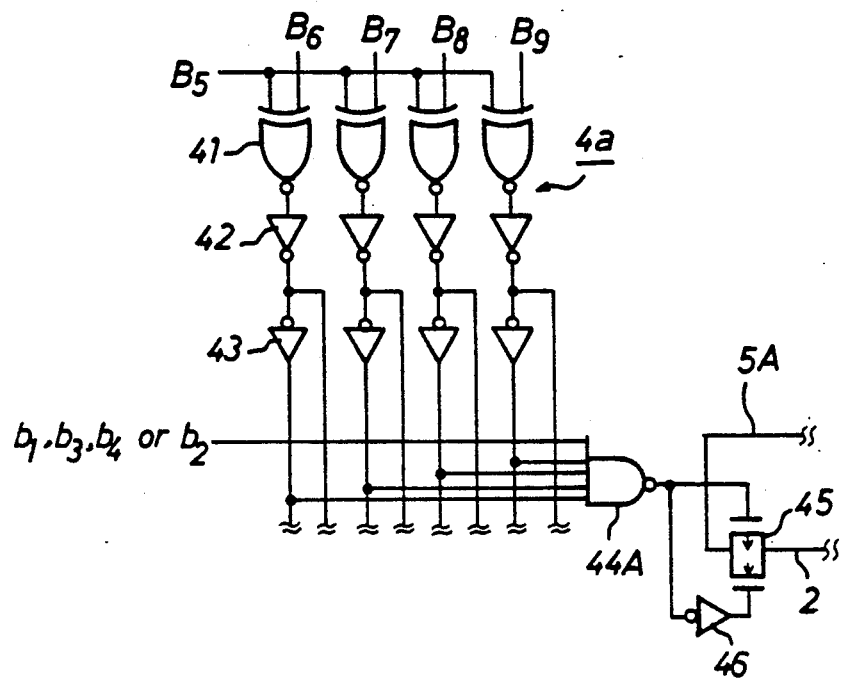
FIGS. 10(a) and 10(b) represent respectively partial logic circuits of each pair of line decoders shown in FIG. 8.
Figure 10:
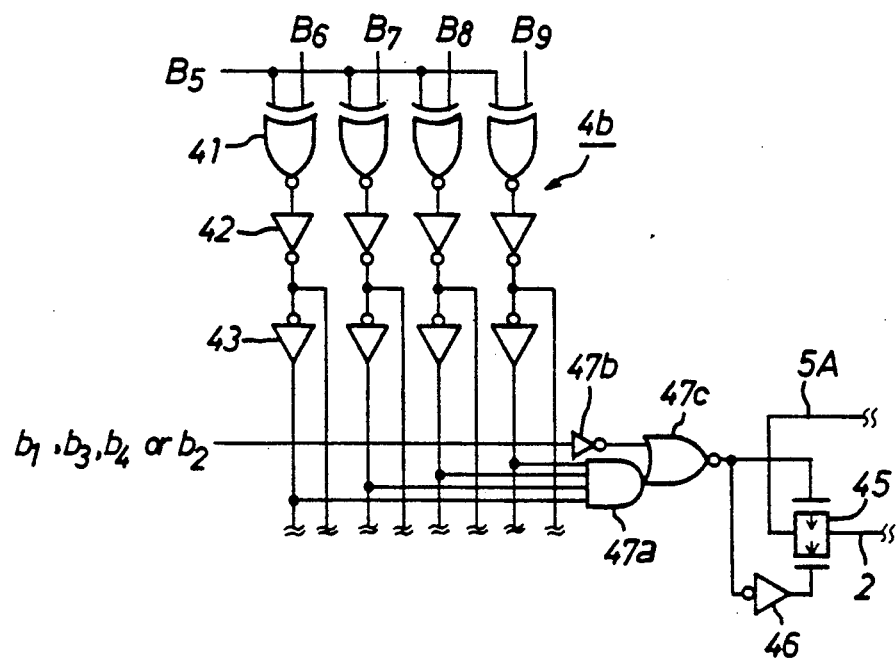

FIG. 10(b) illustrates each of the line decoders 4b to 4b which has the construction similar to that of the circuit portion of line decoder 4a shown in FIG. 10(a). Each of the line decoders 4b to 4b includes an AND gate 47a which is connected at its input terminals respectively to the output terminals of inverters 43 to 43. An inverter 47b of line decoder 4b for the square array A is connected at its input terminal to the signal line $b_1$ (see FIG. 8) to invert a signal appearing on the signal line $b_1$, and an inverter 47b of line decoder 4b for the square array B is connected at its input terminal to the signal line $b_3$ (see FIG. 8) to invert a signal appearing on the signal line $b_3$. An inverter 47b of line decoder 4b for the square array C is connected at its input terminal to the signal line $b_4$ (see FIG. 8) to invert a signal appearing on the signal line b4, and an inverter 47b of line decoder 4b for the square array D is connected at its input terminal to the signal line b2 (see FIG. 8) to invert a signal appearing on the signal line b2. A NOR gate 47c of line decoder 4b for the square array A is activated by AND gate 47a and inverter 47b to select the line lead wire 2 connected through the corresponding switching element 6 to the resistor r defining a least significant position in the square array A. A NOR gate 47c of line decoder 4b for the square array B is activated by AND gate 47a and inverter 47b to select the line lead wire 2 connected through the corresponding switching element 6 to the resistor r defining a least significant position in the square array B. A NOR gate 47c of line decoder 4b for the square array C is activated by AND gate 47a and inverter 47b to select the line lead wire 2 connected through the corresponding switching element 6 to the resistor r defining a least significant position in the square array C. A NOR gate 47c of line decoder 4b for the square array D is activated by AND gate 47a and inverter 47b to select the line lead wire 2 connected through the corresponding switching element 6 to the resistor r defining a least significant position in the square array D. In the modification, the line decoders 4a and 4b respectively for the square arrays A, B, C, and D are connected at their output lines 5A to 5A to the multiplexer 7, as shown in FIGS. 8 and 10.

In operation, when a ten-bit digital signal is applied to the input lines $B_0$ to $B_9$, the multiplexer 7 cooperates with the decoder 8 responsive to signals appearing on the input lines $B_0$, $B_1$ to permit electrical connection between the external line 9 and the output line 5A extending from the line decoder for one of the square arrays A, B, C and D. This means that the multiplexer 7 cooperates with decoder 8 to select one of the square arrays A to D on a basis of the signals appearing on the input lines $B_0$, $B_1$. At the same time, the row decoder 3a for the selected square array produces a selection signal on one of row lead wires 1, ..., 1 in relation to signals appearing on the input lines $B_2$ to $B_5$. This activates the switching elements 6, ..., 6 connected to the one of row lead wires 1, ..., 1. Meanwhile, the line decoder 4a selects one of line lead wires 2, ..., 2 in relation to signals appearing on the input lines $B_5$ to $B_9$. Thus, the one of line lead wires 2, ..., 2 is electrically connected by the line decoder 4a to the output line 5A. This means that a divided voltage appearing at one of the common terminals p, ..., p in the selected square array is applied through the selected line lead wire and the output line 5A by multiplexer 7 to the external line 9 as a voltage to be compared with an analog input voltage. In the remaining square arrays which are not selected by the multiplexer 7, the row and line decoders 3b, 4b are activated because signals appearing respectively on the signal lines $b_1$ to $b_4$ are maintained selectively in a low level regardless of levels in signals appearing on the input lines $B_2$ to $B_9$. This means that a divided voltage with the lowest level from each of the remaining square arrays appears on each of the output lines 5A.

As understood from the above description, the row and line decoders 3b, 4b for the remaining square arrays which are not selected by the multiplexer 7 are simultaneously activated together with activation of the row and line decoders 3a, 4a for the selected square array to maintain in fixed lowest levels divided voltages within the remaining square arrays respectively. Thus, it will be understood that even if signals appearing on the input lines $B_2$ to $B_9$ change, fluctuations of parasitic capacities in all the square arrays A to D are prevented to facilitate more shortening of the settling time or higher speed in digital-to-analog conversion. The inventors' experiments have shown that the settling time is substantially equal to a quater of the settling time in prior art of FIG. 11.

For the actual practice of the present invention, the string of resistors r, ..., r may be also folded along the row direction into four square arrays A to D.

Although certain specific embodiments of the present invention have been illustrated and described herein, it is obvious that many modifications thereof are possible. The inventior, therefore, is not intended to be restricted to the exact showing of the drawings and description thereof, but is considered to include reasonable and obvious equivalents.

What is claimed is:

1. A digital-to-analog converter of the resistor string type for converting a digital signal into an analog signal, comprising:

a string of resistors for dividing a reference voltage into a series of divided voltages; and switch matrix circuit means coupled with said resistors for selectively generating the divided voltages as the analog signal when activated in response to the digital signal;

wherein said string of resistors are divided into four square arrays, one of said four square arrays being arranged diagonally to another of said four square arrays respectively; and wherein said switch matrix circuit means includes:

four switching means, coupled to said four square arrays, for generating respective divided voltages from said four square arrays when activated respectively;

four decoder means coupled with said four switching means for activating said four switching means in response to the digital signal respectively and for generating the respective divided voltages from said four switching means in relation to a portion of the digital signal respectively; and selection means responsive to the digital signal for selecting one of the respective divided voltages from said four decoder means in relation to the remaining portion of the digital signal to generate the selected one divided voltage as the analog signal.

2. A digital-to-analog converter as claimed in claim 1, wherein said decoder means except the one of said four decoder means related to said selected one divided voltage are arranged to maintain the remaining respective divided voltages except said selected one divided voltage in a predetermined level in relation to the remaining portion of the digital signal respectively.

3. A digital to analog converter as in claim 1, wherein said one and said another of said four square arrays are connected in series, and form a first pair of arrays.

4. A digital to analog converter as in claim 3, wherein the two others of said arrays, other than said first pair, are connected in series, and form a second pair.

5. A digital to analog converter as in claim 4, wherein said reference voltage is connected in series through said first pair and then to said second pair.

6. A digital to analog converter for converting the digital signal into an analog signal, comprising:

a string of resistors for dividing an applied reference voltage into a series of divided voltages, said string of resistors being organized as a plurality of arrays which are connected in series to one another to form a string; and decoding means, operatively coupled to said arrays of resistors, and coupled to a number of most significant bits of said digital signal, for selecting one of said arrays of resistors as being an array which will produce said analog signal based on said number of most significant bits.

7. A converter as in claim 6 wherein there are four arrays, and said number of most significant bits is two.

8. A converter as in claim 7 wherein said arrays are cross-connected to one another, such that each array is connected to an array diagonal to said each array.

9. A converter as in claim 6, further comprising a substrate on which said resistors are arranged, wherein each said array is substantially rectangular in shape on said substrate, and arranged in a folded shape such that each array forms a string of resistors which extends in a first direction, connected by a lead which extends in a second direction perpendicular to said first direction to another string of resistors which extends in a third direction parallel to said first direction.

* * * * *